United States Patent
Inoue et al.

(10) Patent No.: US 7,413,130 B2
(45) Date of Patent: *Aug. 19, 2008

(54) PAPER TAG IDENTIFIED BY USING RADIOFREQUENCY AND METHOD OF MANUFACTURING THE SAME

(75) Inventors: Kosuke Inoue, Fujisawa (JP); Naoya Kanda, Fujisawa (JP); Hiroshi Honma, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/709,157

(22) Filed: Feb. 22, 2007

(65) Prior Publication Data

US 2007/0194135 A1    Aug. 23, 2007

Related U.S. Application Data

(63) Continuation of application No. 11/003,439, filed on Dec. 6, 2004, now Pat. No. 7,185,823.

(30) Foreign Application Priority Data

Feb. 5, 2004    (JP) .............................. 2004-029377

(51) Int. Cl.
  *G06K 19/06* (2006.01)
(52) U.S. Cl. ....................................... 235/492; 235/488
(58) Field of Classification Search ................. 235/492, 235/441, 375, 493, 486, 487, 488
See application file for complete search history.

(56) References Cited

U.S. PATENT DOCUMENTS

| | | | |
|---|---|---|---|
| 6,366,260 B1 | 4/2002 | Carrender | |
| 6,421,013 B1 | 7/2002 | Chung | |
| 6,667,092 B1 | 12/2003 | Brollier et al. | |
| 7,185,823 B2 * | 3/2007 | Inoue et al. | 235/492 |
| 2002/0154607 A1 | 10/2002 | Forstadius et al. | |
| 2003/0197064 A1 | 10/2003 | Saint et al. | |
| 2005/0040934 A1 | 2/2005 | Shanton | |
| 2005/0130425 A1 | 6/2005 | Kanda et al. | |
| 2005/0173541 A1 | 8/2005 | Inoue et al. | |
| 2006/0033624 A1 | 2/2006 | Copeland et al. | |
| 2006/0086805 A1 | 4/2006 | Oozeki et al. | |

FOREIGN PATENT DOCUMENTS

| | | |
|---|---|---|
| JP | 11-150133 | 6/1999 |
| JP | 2000-315697 | 11/2000 |
| JP | 2002-319006 | 10/2002 |
| WO | WO 00/22893 | 4/2000 |
| WO | 00/36555 | 6/2000 |
| WO | 01/48687 | 7/2001 |
| WO | 1413337 | 4/2003 |

* cited by examiner

*Primary Examiner*—Thien M Le
(74) *Attorney, Agent, or Firm*—Antonelli, Terry, Stout & Kraus, LLP.

(57) ABSTRACT

A RFID tag including: a paper-like structure inlaying a RFID thread between a first paper layer and a second paper layer, the RFID thread being connected to a RFID chip through bumps to an antenna arranged onto a base member and being formed with a protecting material provided with a window at a position in which the RFID chip corresponds; wherein a height of an upper surface of the protecting material is larger than a height of an upper surface of the RFID chip.

7 Claims, 11 Drawing Sheets

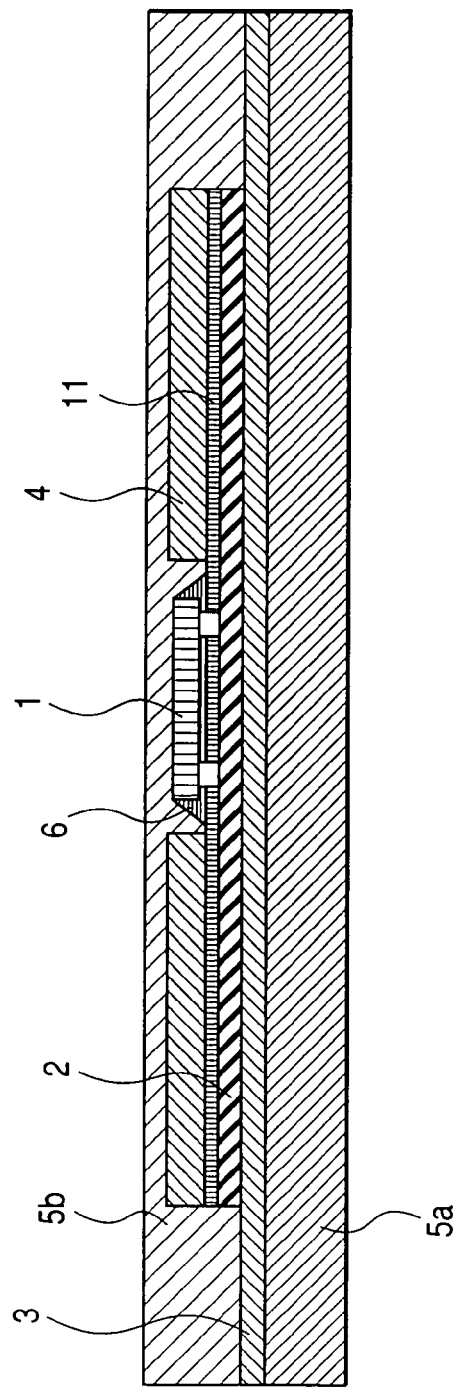
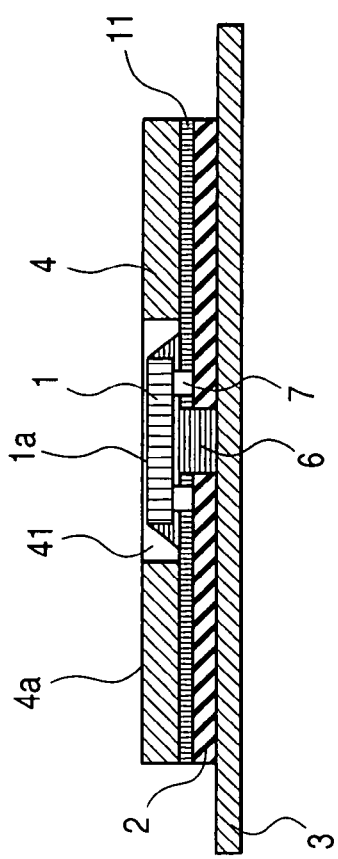

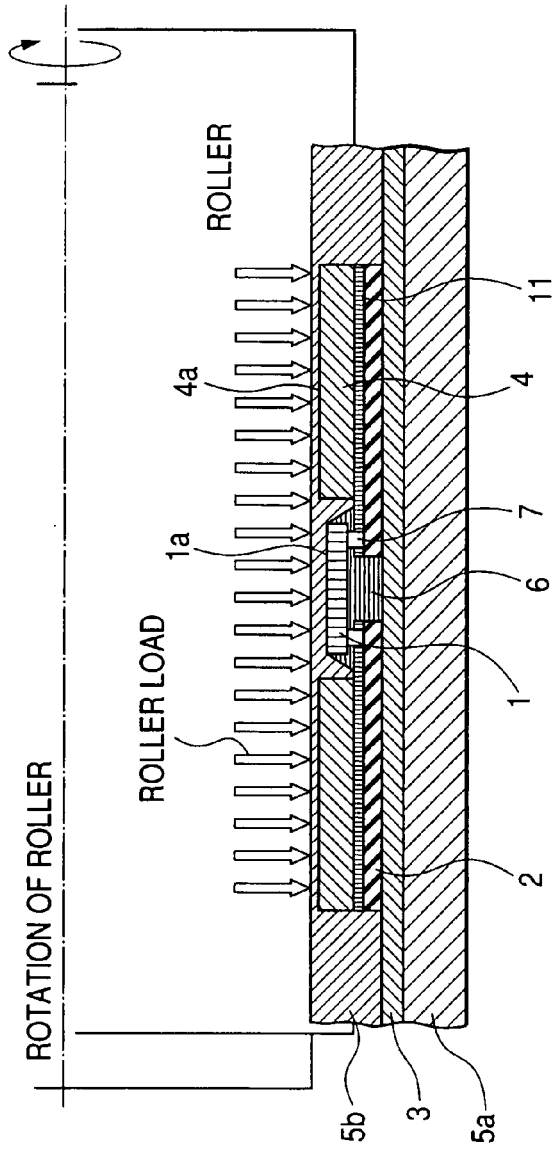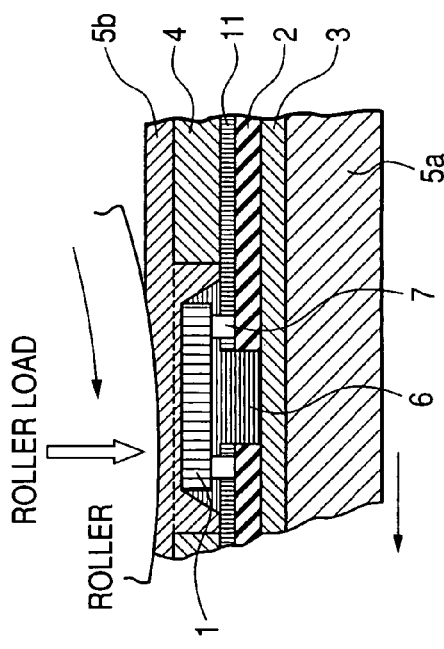
FIG. 9(A)
FIG. 9(B)

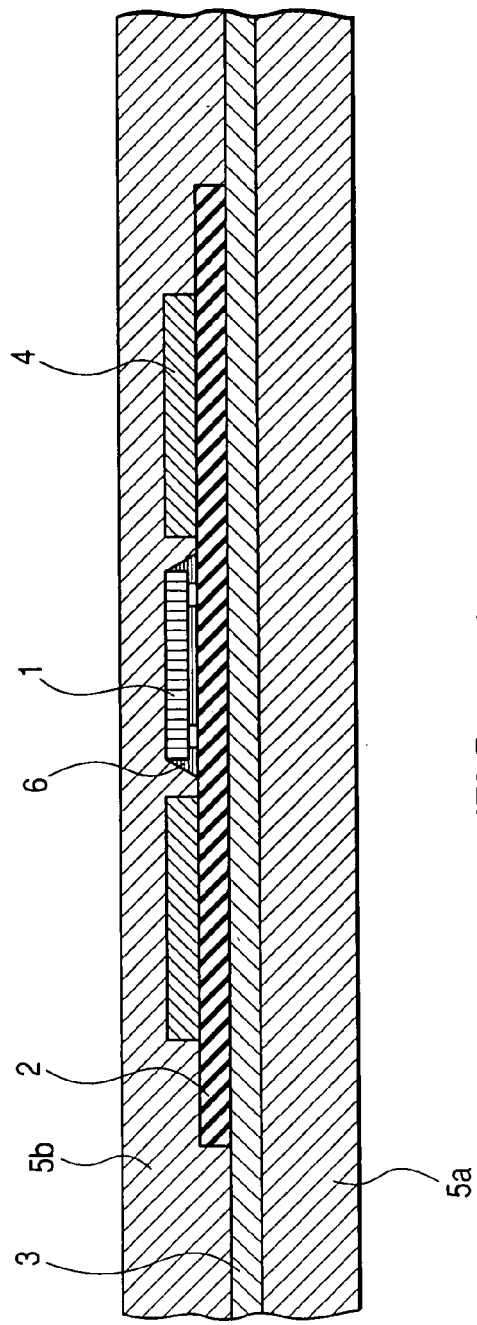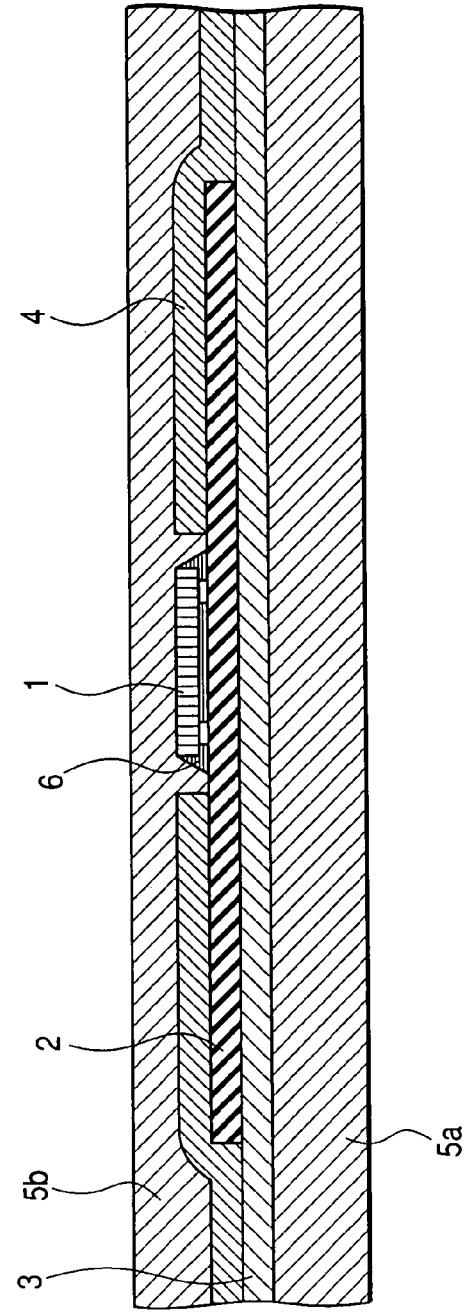

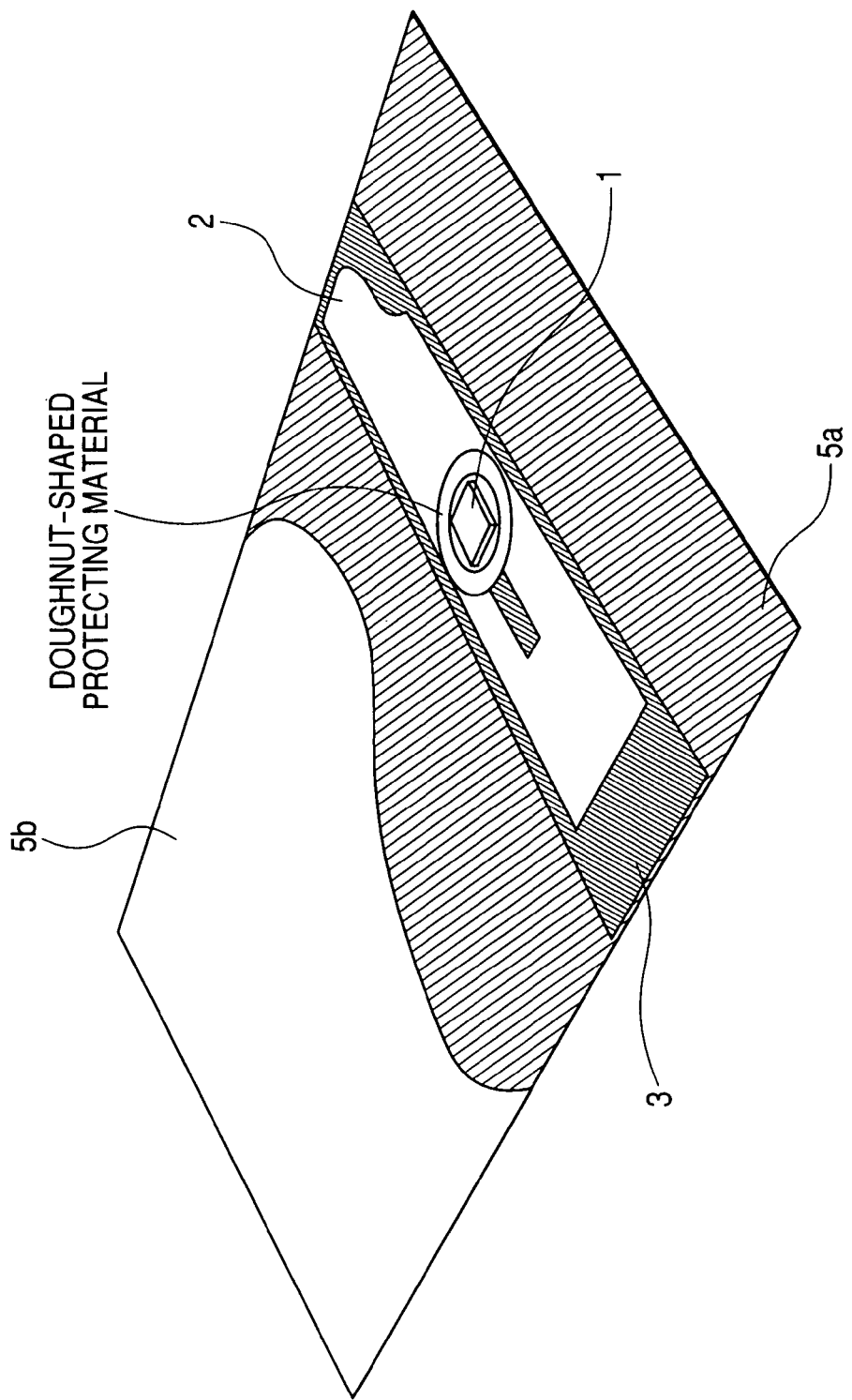

PAPER TAG IDENTIFIED BY USING RADIOFREQUENCY AND METHOD OF MANUFACTURING THE SAME

CROSS REFERENCE TO RELATED APPLICATION

This is a continuation of U.S. application Ser. No. 11/003,439, filed Dec. 6, 2004 now U.S. Pat. No. 7,185,823. This application relates to and claims priority from Japanese Patent Application No. 2004-029377, filed on Feb. 5, 2004. The entirety of the contents and subject matter of all of the above is incorporated herein by reference.

BACKGROUND OF THE INVENTION

The present invention relates to a paper-like RFID (radiofrequency identification) tag with an RFID thread inlaid between paper layers, the RFID thread comprising an RFID chip and an antenna coupled together electrically, the RFID chip having identification data (ID data) stored in memory, as well as a method of manufacturing the same.

Conventional ID card manufacturing methods are known in Japanese Patent Laid-Open Nos. Hei 11-150133 (Patent Document 1) and 2000-315697 (Patent Document 2). In Patent Documents 1 and 2 it is described that a film formed with wiring patterns and an antenna coil and with a thin IC chip mounted thereon, as well as an adhesive-laminated cover film, are inlaid between a pair of heated rolls and are laminated by the pair of heated rolls to fabricate an IC card.

A method of making paper or a film-like tag is known in International Publication No. WO 00/36555 (Patent Document 3). In Patent Document 3 it is described that a first cover film roll and a second cover film roll are used, a semiconductor chip having been machined to have long sides of 0.5 mm or less is inlaid between first and second cover films made of paper or a synthetic paper for example, and a completed tag including the semiconductor chip is wound round a winding roll. It is also described therein that there are a case where an antenna is attached beforehand to the semiconductor chip and a case where an antenna is formed by printing to the first or the second film or by bonding wire thereto with use of a conductive adhesive at the time of inlaying the chip. It is further described therein that on the surface of an intermediate bonding film in which a semiconductor chip is inlaid there is another adhesive such as, for example, a urethane type, cyanol type, or ultraviolet cure type adhesive to ensure flatness and rigidity of a completed tag at low temperatures.

As a method of manufacturing a sheet-like product for the prevention of forgery, the method disclosed in Japanese Patent Laid-Open No. 2002-319006 (Patent Document 4) is known. In Patent Document 4 it is described that a thread comprising a semiconductor chip bonded to one side of a narrow slit film, the semiconductor chip having an antenna and having a size of one side of 0.5 mm or less, is inlaid into a groove formed in a paper layer and is thereby affixed to the inner surface of the groove while being buried within the paper layer.

SUMMARY OF THE INVENTION

As to the RFID tag, studies are being made about adopting it as a substitute for bar codes in various distribution processes. In order not to restrict articles to which the RFID tag is to be applied, it is keenly desired that the total thickness of the RFID tag be about 0.1 mm or less. Besides, from the standpoint of printability and producibility it has so far been required that a paper-like RFID tag be produced by inlaying an RFID chip in between paper layers in a paper making process.

In the paper making process, pressurization, heating, and dewatering, are performed using a large number of rollers in order to ensure smoothness of the paper surface, but in these processes the roller load is very large. If such a very large load is imposed on the RFID chip inlaid between paper layers, the chip will be destroyed. If the roller load is greatly weakened in an effort to solve this problem, the smoothness of the surface of the RFID tag will be greatly deteriorated in comparison with the ordinary type of paper.

In Patent Documents 1 to 3, a thorough consideration is not given about this point.

According to the construction disclosed in Patent Document 4, the paper layer is maid thin at only the portion thereof in which the thread is to be inlaid and a groove for inlaying therein of the thread is formed in the paper layer, whereby the thicker portion of the paper layer serves as a cushion when pressure is applied to the paper.

However, in the case where an RFID chip is inlaid between paper layers to fabricate a paper-like RFID tag in accordance with a paper making process, it is impossible for the thicker portion of paper to bear a very large roller load, resulting in that the large load acts on the RFID chip and destroys the chip.

Further, if an RFID chip with antenna formed thereon is used, the antenna is compelled to be very small in size due to a restriction on the profile size of the RFID chip, with the result that the communication distance becomes very short. Consequently, the use as an RFID tag is greatly limited.

It is an object of the present invention to solve the above-mentioned problems and provide a paper-like RFID tag of high quality having a thickness of about 0.1 mm or less, having a surface smoothness approximately equal to that of the ordinary type of paper, and having a long communication distance not limited by the profile size of an RFID chip.

It is another object of the present invention to provide a method capable of manufacturing the aforesaid paper-like RFID tag of high quality.

According to the present invention, for achieving the above-mentioned objects, there is provided a paper-like RFID tag wherein an RFID thread is inlaid between a first paper layer and a second paper layer to afford a paper-like structure, the RFID thread comprising a base member, an antenna formed by a metallic foil and bonded onto the base member, an RFID chip bonded through bumps to the antenna, and a protecting material having a thickness such that the height of an upper surface thereof is larger than that of the RFID chip. In this case, the base member is a film or a tape.

Preferably, in the above paper-like RFID tag, the protecting material has a window within which the RFID chip is received.

Preferably, in the above paper-like RFID tag, the protecting material is a film-like material or a metallic material.

Preferably, in the above paper-like RFID tag, the RFID thread is a tape-like thread wherein the width of the antenna and that of the base film are 3 mm or less.

According to the present invention there also is provided a method of manufacturing a paper-like RFID tag, comprising: an RFID thread assembly process of forming an RFID thread, the RFID thread assembly process comprising a metal foil laminated film fabricating process of bonding a metal foil to one surface of a base member to form a metal foil laminated film, an antenna pattern forming process of patterning the metal foil in the metal foil laminated film fabricated in the metal foil laminated film fabricating process to form an antenna, a protecting material bonding process of bonding a protecting material around an RFID chip on the antenna, the protecting material having a thickness such that the height of an upper surface thereof becomes larger than that of the RFID chip when the RFID chip is bonded by bonding bumps to the antenna, and an RFID chip bonding process of bonding the bumps of the RFID chip to the antenna; and a paper making process of inlaying the RFID thread formed in the RFID thread assembly process in between a first paper layer and a second paper layer and conducting heating, pressurizing and dewatering with use of rolls and drying.

Preferably, in the antenna pattern forming process in the above RFID thread assembly process, a resin layer forming process of forming on the metal foil a resin layer for patterning the metal foil to form the antenna is included.

Preferably, in the above RFID thread assembly process, the RFID thread is a tape-like RFID thread wherein the width of the antenna and that of the base film are 3 mm or less. Preferably, in the above paper making process, the tape-like RFID thread is fed continuously and is inlaid between the first and the second paper layer.

Preferably, in the protecting material bonding process in the above RFID thread assembly process, the protecting material is a protecting tape formed with a window for receiving the RFID chip therein and higher in rigidity than the first and second paper layers.

Preferably, in the protecting material bonding process in the RFID thread assembly process, the protecting material is a plastic or metallic material.

Preferably, in the protecting material bonding process in the RFID thread assembly process, the protecting material has a C-shaped or doughnut-shaped surface.

Preferably, in the paper making process, a multi-cylinder paper machine is used.

According to the present invention there is further provided a method of manufacturing a paper-like RFID tag, comprising: an RFID thread assembly process of forming an RFID thread, the RFID thread assembly process comprising a metal foil laminated film fabricating process of bonding a metal foil to one surface of a base member to form a metal foil laminated film, an antenna pattern forming process of patterning the metal foil in the metal foil laminated film fabricated in the metal foil laminated film fabricating process to form an antenna, a protecting tape bonding process of bonding a protecting tape around an RFID chip on the antenna, the protecting tape having a thickness such that the height of an upper surface thereof becomes larger than that of the RFID chip when the RFID chip is bonded by bonding bumps to the antenna, and an RFID chip bonding process of bonding the bumps of the RFID chip to the antenna; and a paper making process of inlaying the RFID thread formed in the RFID thread assembly process in between a first paper layer and a second paper layer and conducting heating, pressurizing and dewatering with use of rolls and drying.

According to the present invention, a paper-like RFID tag of high quality capable of performing a long-distance communication and having a smooth and thin paper surface with a thickness of about 0.1 mm or less can be fed stably.

According to the present invention, a paper-like RFID tag of high quality capable of performing a long-distance communication and having a smooth and thin paper surface with a thickness of about 0.1 mm or less can be manufactured.

BRIEF DESCRIPTION OF THE DRAWING

These and other features, objects and advantages of the present invention will become more apparent from the following description when taken in conjunction with the accompanying drawings wherein:

FIG. 2 is a sectional view as seen in the direction of arrow A-A in FIG. 1;

FIG. 3 is a sectional view as seen in the direction of arrow B-B in FIG. 1;

FIGS. 9(A) and 9(B) are diagrams for explaining an RFID chip protecting mechanism using a protecting tape (protecting material) in the paper making process as a process for manufacturing the paper-like RFID tag according to the present invention, in which FIG. 9(A) is a sectional view as seen in a direction in which the RFID thread is inlaid between first and second paper layers and is delivered in this state and FIG. 9(B) is a partial enlarged sectional view as seen in the direction of a roller axis;

FIG. 10 shows another example of a protecting tape (protecting material) used in the paper-like RFID tag;

FIG. 11 shows a further example of a protecting tape (protecting material) used in the paper-like RFID tag;

FIG. 13 shows a still further example of a protecting tape (protecting material) used in the paper-like RFID tag; and FIGS. 14(A) and 14(B) are diagrams for explaining a comparative example in which a protecting tape (protecting material) is not used in the paper making process as a process for manufacturing the paper-like RFID tag, in which FIG. 14(A) is a sectional view as seen in a direction in which an RFID thread in a comparative example is inlaid between first and second paper layers and is delivered in this state and FIG. 14(B) is a partial enlarged sectional view as seen in the direction of a roller axis in the comparative example.

DETAILED DESCRIPTION OF PREFERRED EMBODIMENTS

With reference to the drawings, the present invention will be described hereinunder by way of embodiments thereof which are preferred for manufacturing paper-like RFID tags related to the present invention.

Figure 1:
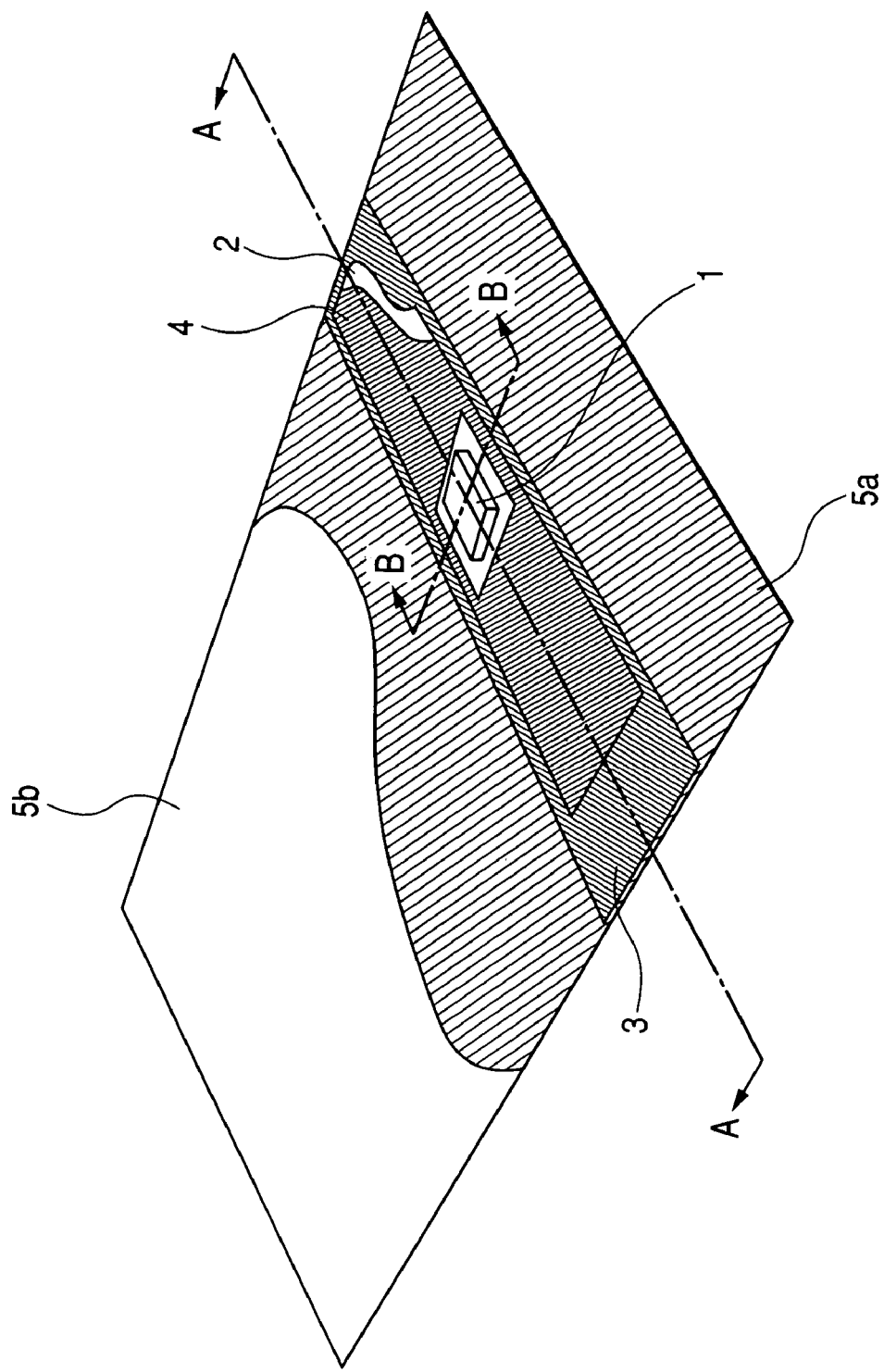
FIG. 1 is a partially cut-away perspective view of a paper-like RFID tag according to an embodiment of the present invention.

First, a description will be given about the construction of a paper-like RFID tag according to a first embodiment of the present invention. FIG. 1 is a partially cut-away perspective view of the paper-like RFID tag of the first embodiment, FIG. 2 is a sectional view as seen in the direction of arrow A-A in FIG. 1, and FIG. 3 is a sectional view as seen in the direction of arrow B-B in FIG. 1. In FIG. 3, a bonded portion between an RFID chip 1 and an antenna 2 is shown in detail and a first paper layer 5a and a second paper layer 5b, which are shown in FIGS. 1 and 2, are omitted.

The paper-like RFID tag of this first embodiment comprises an RFID chip 1 having memory for storing identification data (ID data) and other information, an antenna 2 formed by patterning a metal foil which is electrically bonded (connected) to bumps of the RFID chip 1, a thread 3 (a base member which is a film or a tape) with the antenna affixed to one surface thereof, a protecting material (e.g., a protecting tape) 4 disposed around the RFID chip 1 on the antenna 2, and a first paper layer 5a and a second paper layer 5b between which is inlaid an RFID thread, the RFID thread comprising the thread 3, the antenna 2, the RFID chip 1, and the protecting material 4, which antenna 2, RFID chip 1 and protecting material 4 are provided on the thread 3.

The RFID chip 1 has a thickness of about 45 μm, including the thickness of bumps 7 and a size of about 400 μm square. The RFID chip 1 is provided on a functional surface thereof with four square gold bumps 7 of about 63 μm square at a pitch of about 300 μm. The antenna 2 is for receiving energy by wireless and for providing (giving) a specific signal pattern to communicate data stored in memory by wireless. For example, the antenna 2 is a metal foil (e.g., aluminum foil) of about 7 μm in thickness which has been processed into a shape permitting transmission and reception of a radio wave with a frequency of, say, 2.45 GHz.

In this case, the antenna 2 is in a rectangular shape having a longitudinal size of about 52 mm and a transverse size of about 0.6 to 1.5 mm. A generally L-shaped slit is formed in part of the antenna by patterning. The antenna 2 is affixed with an adhesive to the thread (base film or base tape) 3 which is constituted by a polyester film, including polyethylene telephthalate (PET) film, having a thickness of about 12 μm.

The protecting tape (protecting material) 4 has a window 41 of a larger area than the RFID chip 1 and is disposed around the RFID chip 1 in such a manner that the chip 1 is positioned within the window 41. The protecting tape 4 is affixed to the antenna 2 and a resin layer 11 which overlies the antenna. As shown in FIGS. 3 and 9(A), in order that the protecting film 4 can bear a very large roller load in a paper making process to be described later, the protecting tape 4 is formed by a polyester film (including PET film), the polyester film being thicker (preferably about 50 μm or more in thickness) than the total thickness of the RFID chip 1 including the bumps 7 so that the height of an upper surface 4a of the protecting film is larger than that of an upper surface 1a of the RFID chip 1, and the polyester film being higher in rigidity than the paper layers.

The RFID chip 1 is bonded and thereby connected electrically to the antenna 2 while passing through the resin layer 11 in a state in which it is received within the window of the protecting tape 4. The bonded portion between the RFID chip 1 and the antenna 2 is protected by a cured underfill resin 6.

In a paper making process to be described later, the RFID thread comprising the thread 3, antenna 2, resin layer 11 which overlies the antenna, RFID chip 1, and protecting tape 4, is inlaid between the first paper layer 5a and the second paper layer 5b which are superimposed one on the other, then is heated, pressurized and dewatered by rolls, and is finally dried, to afford a paper-like RFID tag incorporating the RFID chip 1 and the antenna 2 connected thereto with the RFID thread inlaid between the first and second paper layers 5a, 5b.

Since the maximum thickness of the RFID thread incorporated in the RFID tag is about 70 μm, a total RFID tag thickness of about 0.1 mm, which is an ordinary paper thickness, can be realized. Besides, since the RFID tag completed is paper-like, the same tag can subsequently be printed easily according to purposes of use. Moreover, since plural such tags are wound up in a continuous state onto a roll, individual RFID tags can be cut off as necessary.

As described above, since the maximum thickness of the thread having mounted thereon the RFID chip 1 to be incorporated in the RFID tag is about 70 μm, the total thickness of the RFID tag can be set at about 0.1 mm which is about the same as the thickness of the ordinary type of paper.

Further, since the protecting tape 4 higher in rigidity than the paper layers is disposed around the RFID chip 1 so that the upper surface 4a of the protecting tape becomes higher than the upper surface 1a of the RFID chip 1 and so that the protecting film 4 bears most of a roller load in the paper making process, it is possible to eliminate a roller load concentrated directly on the RFID chip 1 and thereby prevent destruction of the chip 1.

An example of an RFID tag manufacturing method according to the present invention will be described below with reference to FIGS. 4 to 6. FIGS. 4, 5, and 6 show an example of a paper-like RFID tag manufacturing flow according to the present invention. A paper-like RFID tag 100 related to the present invention can be manufactured successively through (A) a metal foil laminated film fabricating process, (B) a resin layer forming process, (C) an antenna pattern forming process, (D) a protecting tape bonding process, (E) an ultrasonic bonding process, (F) a slitting process, and (G) a paper making process.

(A) Metal Foil Laminated Film Fabricating Process

Figure 4A:
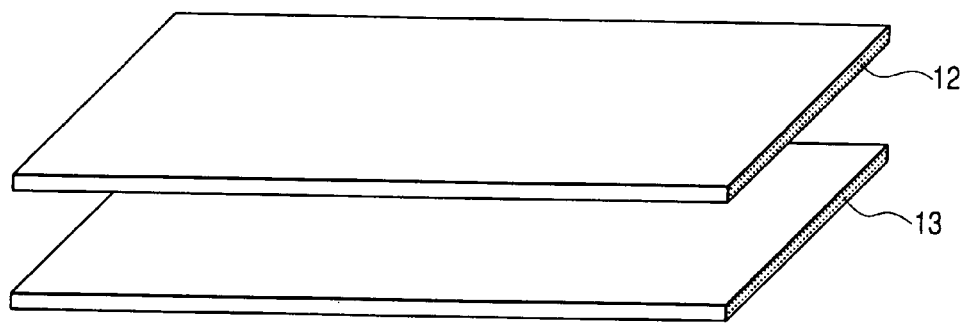
FIGS. 4(A) through 4(C) are diagrams for explaining the first half of a paper-like RFID tag manufacturing flow according to the present invention.

First, as shown in FIG. 4(A), a metal foil (e.g., aluminum foil) 12 of about 7 μm in thickness for forming the antenna 2 and a polyester film (including PET film) 13 of about 12 μm in thickness serving as the thread 3 are provided as base materials.

For example an aluminum foil 12 is disposed on one surface of for example a PET film 13 through an adhesive, followed by heat lamination at a temperature of about 150☐ and a pressure of about 5 kgf/cm², to form a metal foil laminated film 10 as a laminate comprising the PET film 13 and the metal foil 12 bonded thereto.

(B) Resin Layer Forming Process

Figure 4B:
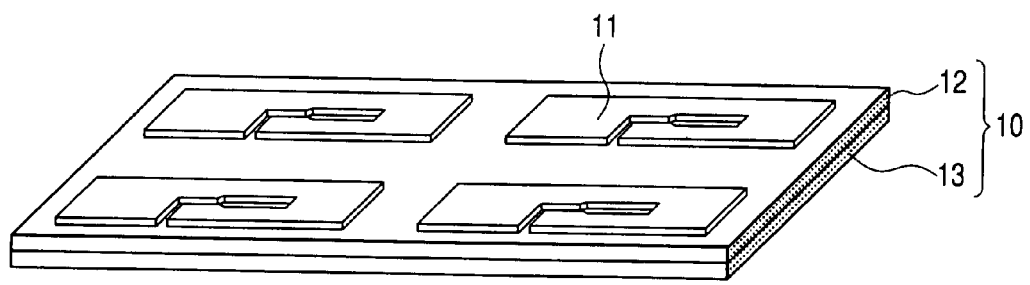

As shown in FIG. 4(B), a resin layer 11 of 1 to 6 μm in thickness which has been processed into a desired antenna pattern shape is formed on the surface of the metal foil (e.g., aluminum foil) 12 in the metal foil laminated film 10 fabricated in the process (A), by means of gravure printing or rotary screen printing. As the material of the resin layer 11 there is used a material which functions as resist at the time of etching the aluminum foil 12 in the next process.

The method for forming the resin layer 11 is not limited to gravure printing or rotary screen printing, but the resin layer 11 may be formed by the conventional photoetching technique involving applying a photosetting resin to the surface of the aluminum foil 12 in the metal foil laminated film 10 without patterning, curing the photosetting resin into a specific pattern with use of a mask, and removing the other portion than the specific pattern. In this case, the coating thickness is adjusted in accordance with the bump size and shape of the RFID chip 1 mounted.

At this stage, sprocket holes may be formed by die forming in both transverse ends of the metal foil laminated film 10, whereby the conveyance and alignment in the succeeding reel-to-reel manufacture become easier, although this method is not adopted in the present invention.

(C) Antenna Pattern Forming Process

Figure 4C:
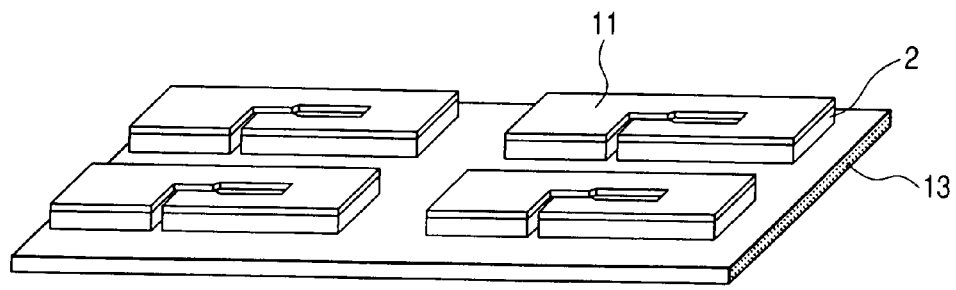

Next, as shown in FIG. 4(C), the portion of the aluminum foil 12 exposed from the resist in the antenna pattern of the resin layer 11 is removed by etching to form the antenna 2. For example, the etching is performed by exposing the area of the aluminum foil 12 exposed from the resin layer 11 to NaOH (120 g/l) as an etchant at a temperature of 50□. An aqueous iron (III) chloride solution or hydrochloric acid is also employable as the etchant.

(D) Protecting Tape Bonding Process

Figure 5A:
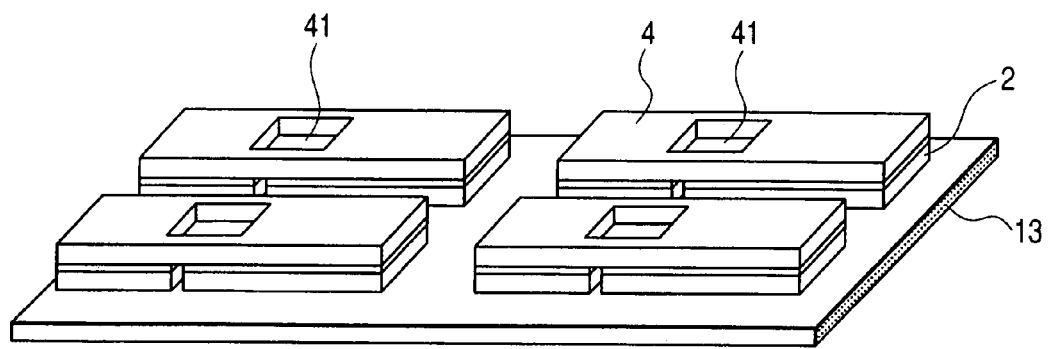
FIGS. 5(A) through 5(C) are diagrams for explaining the latter half thereof.
Figure 6:
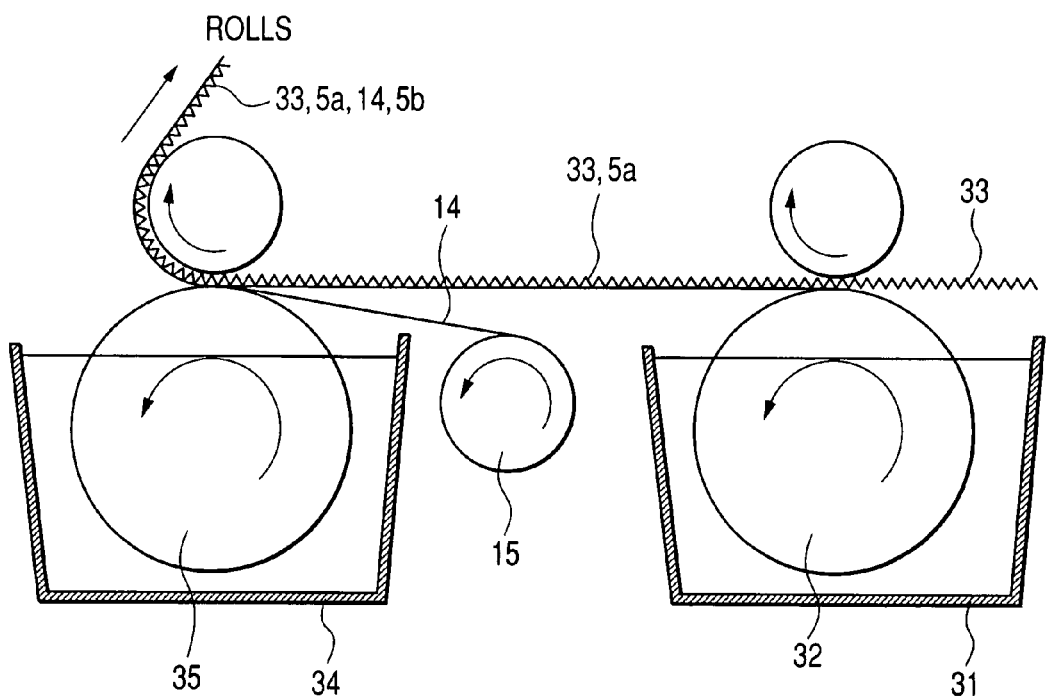
FIG. 6 is a diagram for explaining an example of a paper making process used in manufacturing the paper-like RFID tag.

Next, as shown in FIG. 5(A), a protecting tape 4 higher in rigidity than the paper layers and capable of bearing a very high roll load [about 6100 to 153000 kgf/m in terms of a maximum value of a linear pressure (a load per unit roller length)] in the paper making process to be described later is affixed (fixed), with use of an adhesive, onto the antenna 2 and the resin layer 11 formed above.

The protecting tape 4 covers most of the upper surfaces of the antenna 2 and the resin layer 11, but the portion thereof corresponding to position of the RFID chip 1 at which the chip 1 is to be bonded to the antenna is subjected to a punching work to form the window 41. The shape of the window 41 may be square as shown in the drawing or may be circular or the like.

As the protecting tape 4 there may be used a polyester film (including PET film) with an adhesive present throughout one surface thereof and higher in rigidity than the paper layers. As to the thickness of the protecting tape 4, it is necessary to select a value larger than the total thickness of the RFID chip so that the upper surface 4a of the protecting tape becomes higher than the upper surface 1a of the RFID chip 1 when the bumps of the RFID chip are bonded to the antenna 2, as shown in FIGS. 3 and 9(A). For example, when the total thickness of the RFID chip is about 45 μm, of which the thickness of the chip body is about 30 μm and the bump height is about 15 μm), it is necessary that the thickness of the protecting tape 4 be about 45 μm or more in an affixed state thereof to the antenna 2 and the resin layer 11 which overlies the antenna. Taking a process error into account, it is preferable that the thickness of the protecting tape 4, including the resin layer 11, be about 50 μm or more.

Thus, the thickness of the protecting tape 4 higher in rigidity than the paper layers is set larger than the total thickness (about 45 μm) of the RFID chip 1 so that the upper surface 4a of the protecting tape becomes higher than the upper surface 1a of the RFID chip 1, whereby the protecting tape 4 can bear most of the roller load in the paper making process to be described later and hence it is possible to eliminate the roller load which is concentrated directly on the RFID chip 1 and thereby prevent destruction of the RFID chip 1.

(E) Ultrasonic Bonding Process

Figure 5B:
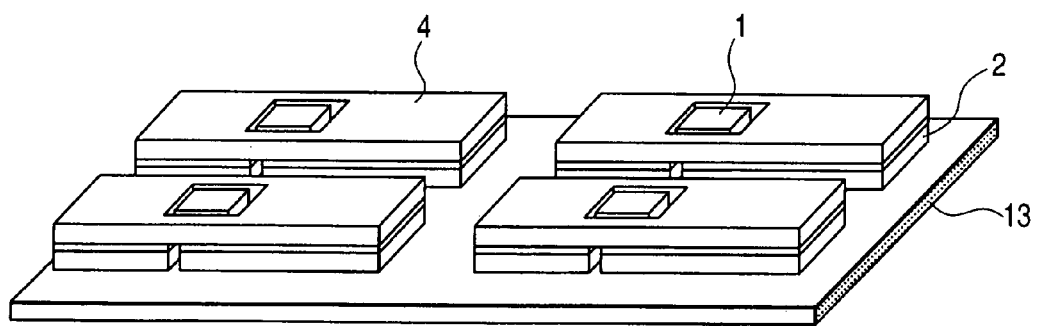

Next, as shown in FIG. 5(B), the RFID chip 1 is conveyed to a predetermined mounting position on the antenna 2 and the overlying resin layer 11 and is aligned with the antenna 2 which has been formed by processing the aluminum foil 12 onto the polyester film (e.g., PET film) 13 as the thread 3. Further, the gold bumps 7 formed on the lower surface of the RFID chip 1 are pushed against the resin layer 11 under pressure. Subsequently, an ultrasonic bonding tool of about 400 μm square is applied to the upper surface of the RFID chip 1 to impart an ultrasonic vibration to the chip upper surface in a planar direction of the chip.

With this ultrasonic vibration, the gold bumps 7 push aside the resin layer 11 and come into contact with the antenna 2 and is bonded thereto. In this case, the atmosphere temperature is kept at room temperature which is lower than the glass transition temperature of the polyester film 13 with the antenna 2 bonded thereto. At a load pressure of 0.2 kgf/mm², the ultrasonic vibration is applied at a frequency of 63.5 kHz and an output of 2 W for a period of about 0.1 to 1 seconds.

Although in this embodiment the ultrasonic vibration is applied at room temperature, heating may be conducted insofar as the temperature is lower than the glass transition temperature. In this embodiment, the thermosetting underfill resin 6 is fed to the bonded portion by means of a dispenser in order to further improve the strength of the bonded portion. The underfill resin 6 cures on heating and thereafter functions to protect the bonded portion.

Through the above processes, the polyester film (e.g., PET film) with antenna patterns formed thereon continuously in the longitudinal direction of the roll and in plural rows in the transverse direction is completed, and the RFID chip is bonded to each antenna 2. Further, the protecting tape 4 is affixed around the RFID chip 1. The window 41 which is a size larger than the RFID chip 1 is formed in the protecting tape 4 and the RFID chip 1 is received within the window 41. The upper surface 1a of the RFID chip 1 is retracted from the upper surface 4a of the protecting tape 4.

(F) Slitting Process

Figure 5C:
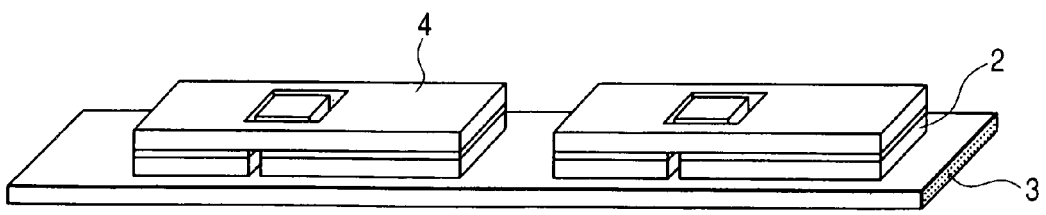
Figure 7:
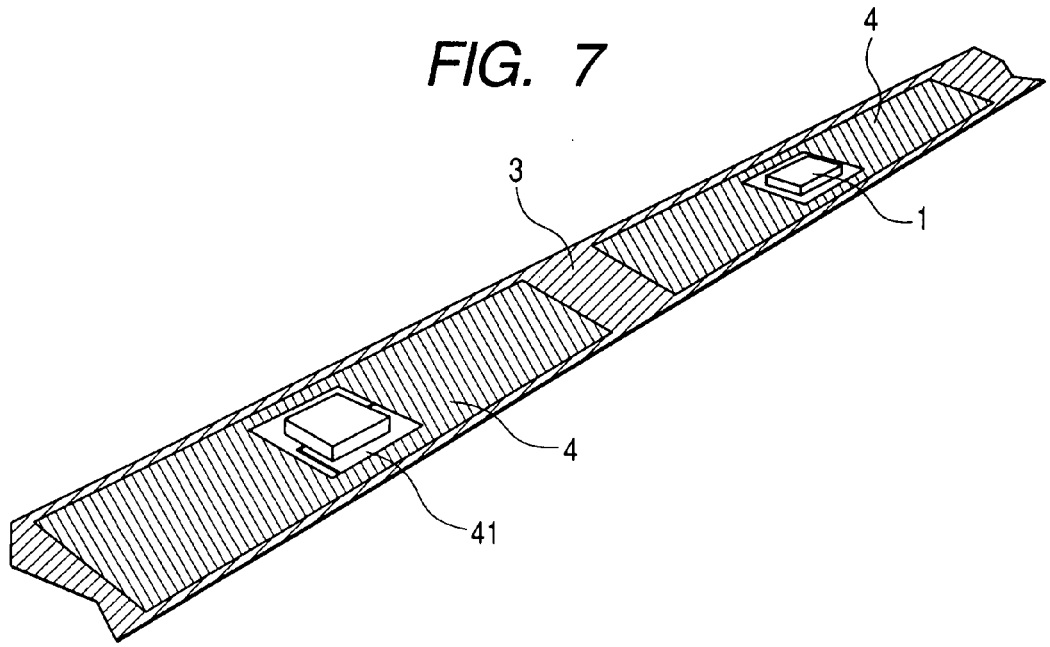
FIG. 7 is a perspective view showing an RFID thread related to the present invention.

Next, as shown in FIG. 5(C), a slitting work is performed for the polyester film 13 to which the RFID chip 1 and the protecting tape 4 are bonded or adhered. A slitting machine available commercially may be used for this slitting work. By this slitting work, the polyester film 13 with the RFID chip or the protecting tape 4 bonded or adhered thereto is processed into a state of thread wound round a narrow reel as shown in FIG. 7 from the wide roll-like sheet.

The thread 3 with RFID chip 1, antenna 2 and protecting tape 4 mounted thereon will hereinafter be referred to as RFID thread 14. In this embodiment, the width of the RFID thread 14 is about 1 to 3 mm, i.e., not larger than 3 mm. The total thickness of the RFID thread 14 is about 70 μm of not larger than 100 μm.

(G) Paper Making Process

Next, as shown in FIG. 6, the RFID thread 14 is inlaid into paper with use of a multi-cylinder paper machine. First, a first paper layer formed by a mesh cylinder 32 in a vessel 31 containing a paper material is transferred onto a felt blanket 33. The first paper layer is conveyed to a mesh cylinder 35 by the felt blanket 33. At the same time, in synchronism with this conveyance, the RFID thread 14 is delivered from a bobbin 15 and is brought into close contact with the first paper layer. Likewise, a second paper layer is formed by the mesh cylinder 35 in a paper material-containing vessel 34 and is superimposed on the first paper layer and the RFID thread 14. The thus superimposed first paper layer 5a, the RFID thread 14 and the second paper layer 5b are conveyed to rolls, such as calendar rolls, by the felt blanket 33. In the rolls, the superimposed first paper layer 5a, the RFID thread 14 and the second paper layer 5b are heated, pressurized and dewatered, then is finally dried.

Figure 8:
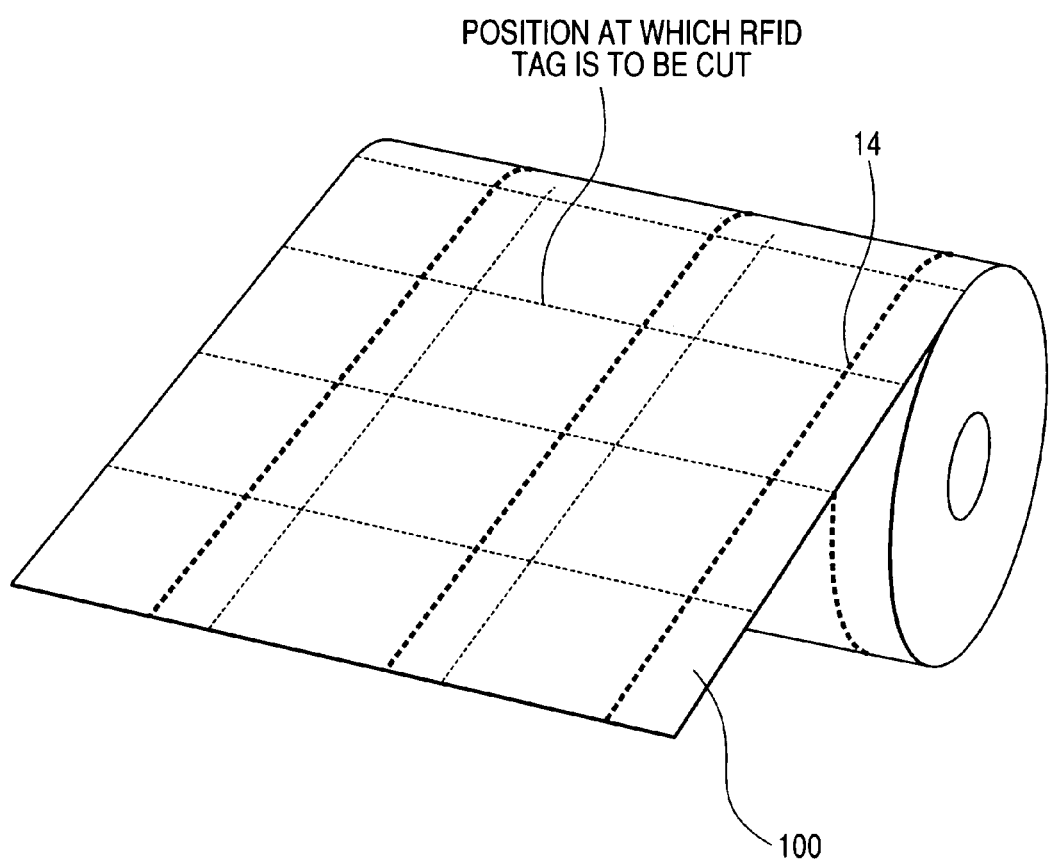
FIG. 8 is a diagram for explaining a state in which the paper-like RFID is wound up onto a roll.

FIG. 8 shows a state in which the paper RFID tag 100 of this embodiment has been completed by the above manufacturing process. The paper-like RFID tag 100 is wound up in the state of a continuous roll. Three rows of paper-like RFID tags 100 are arranged in the transverse direction of the roll. The RFID thread 14 is mounted in the longitudinal direction of the roll in such a state as extends across each paper-like RFID tag 100.

Through the above processes, the paper-like RFID tag 100 incorporating the RFID chip 1 and the antenna 2 connected thereto is completed. Since the maximum thickness of the incorporated RFID thread 14 is about 70 μm, a thickness of about 0.1 mm, which is the thickness of the ordinary type paper, can be attained as the total thickness of the paper-like RFID tag. The completed paper-like RFID tag 100 has not been printed yet at this stage and is therefore printed according to the purpose of use of the RFID tag. Further, since plural paper-like RFID tags 100 are wound up in a continuous state, individual paper-like RFID tags 100 can be cut off as necessary.

Figures 14A, 14B:
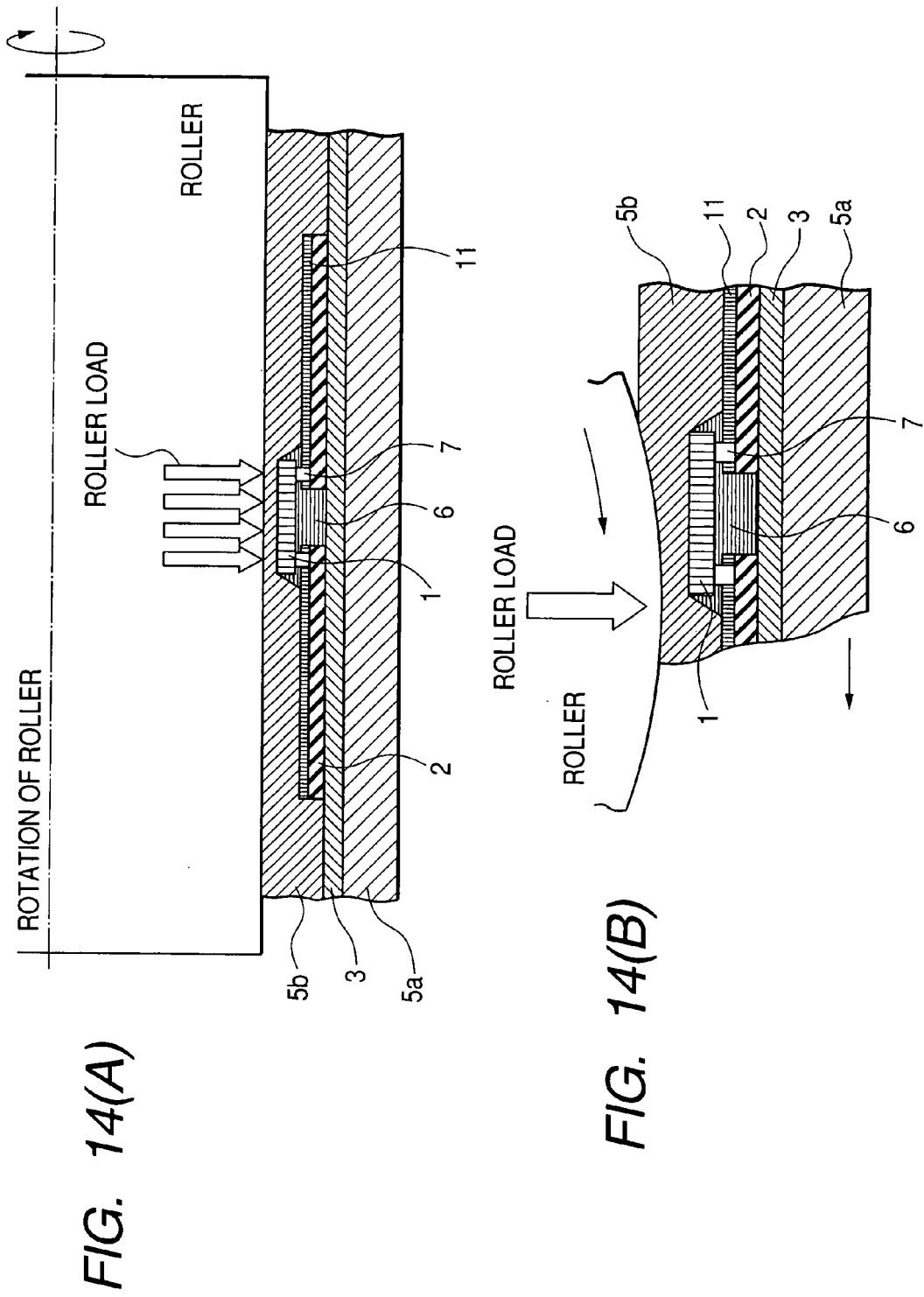

As described above, since the maximum thickness of the thread with the incorporated RFID chip mounted thereon is about 70 μm, the total thickness of the paper-like RFID tag can be set at about 0.1 mm which is about the same as the thickness of the ordinary type of paper. FIGS. 9(A), 9(B) and 14(A), 14(B) show conceptually whether the roller load acting on the RFID chip in the paper making process is large or not depending on whether the protecting tape 4 is present or not. FIGS. 9(A) and 14(A) are sectional views as seen in a direction in which the RFID thread 14 is inlaid between the first and second paper layers and is delivered. FIGS. 9(B) and 14(B) are partial enlarged sectional views as seen in the roller axis direction.

According to this embodiment, as shown in FIGS. 9(A) and 9(B), since the protecting tape 4 can bear most of the roller load in the paper making process, it is possible to prevent the roller load from being concentrated directly on the RFID chip 1 and hence prevent destruction of the RFID chip 1 which is extremely thin.

In a comparative case where the protecting tape 4 is not provided, as shown in FIGS. 14(A) and 14(B), the roller load is concentrated directly on the RFID chip 1, thus resulting in destruction of the ultra-thin RFID chip 1. More particularly, in the comparative example, as shown in FIG. 14(B), when the RFID thread 14 is inlaid between the superimposed first and second paper layers 5a, 5b, the roller rotates and the roller load is concentrated directly on the RFID chip 1, so that a roll-in force and a roll-up force, in addition to the pushing force, act on the RFID chip 1, causing destruction of the ultra-thin RFID chip 1, including the bonded portion.

Thus, according to this embodiment, since the RFID chip 1 is difficult to be destroyed by the roller load, it becomes possible to apply about the same roller load [about 6100 to 153000 kgf/m in terms of a maximum value of a linear pressure (a load per unit roller length)] as in the use of the ordinary type of paper in the paper making process.

As a result, it becomes possible to realize the paper-like RFID tag 100 having about the same smoothness as the ordinary type of paper. The RFID chip 1 in this embodiment is connected to the antenna 2 of a very large size in comparison with the case where antenna is formed on the chip. Consequently, it is possible to greatly enlarge the communication distance and the RFID tag can be applied to various uses.

Although in this embodiment the protecting tape 4 formed by a polyester film (including PET film) is used as the protecting material, the same effect as above can also be obtained by using another film such as a polyimide film higher in rigidity than the paper layers.

Figure 12:
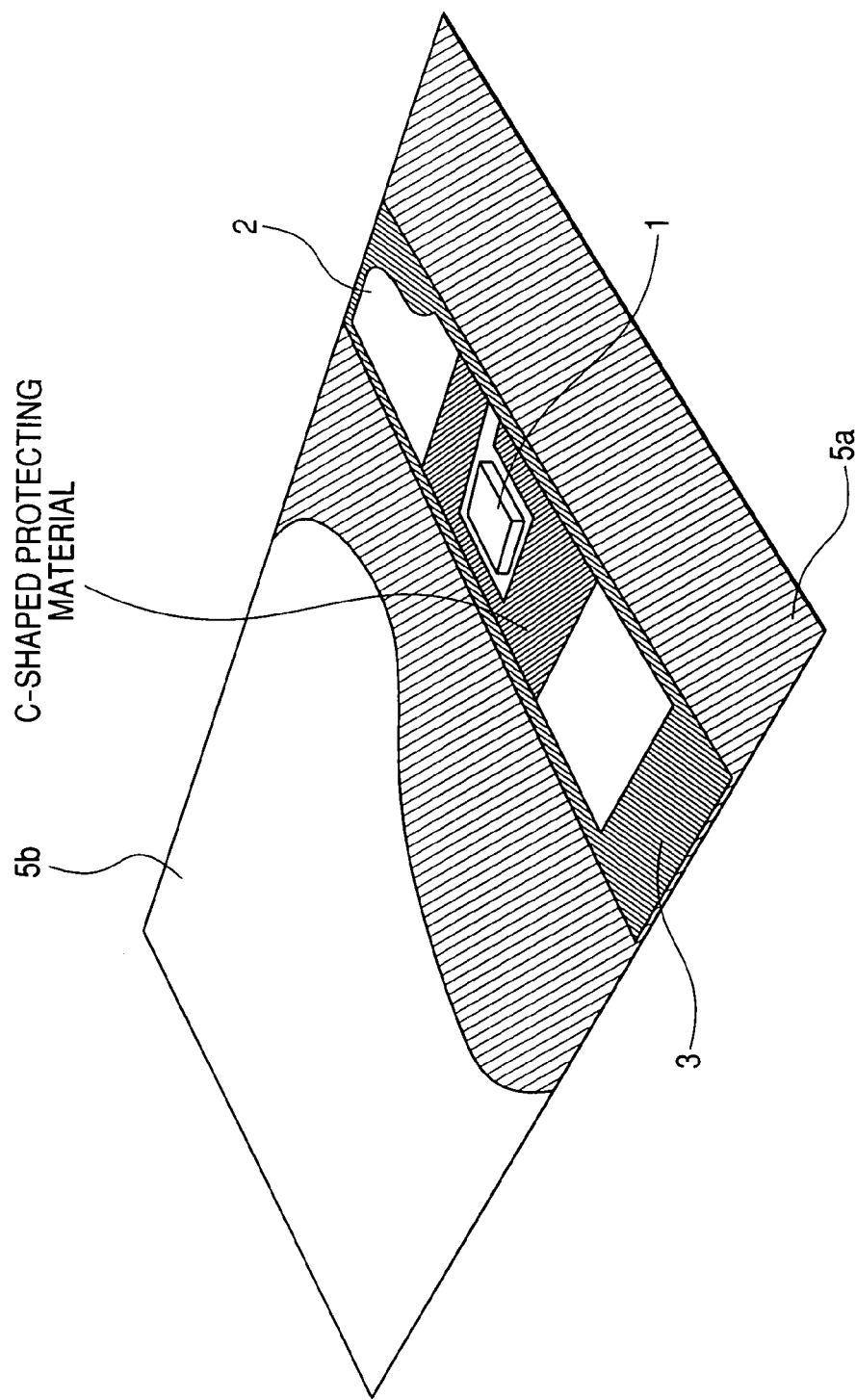
FIG. 12 shows a still further example of a protecting tape (protecting material) used in the paper-like RFID tag.

It is not always necessary for the protecting tape 4 to have the same profile size as the antenna 2, as shown in FIGS. 10 and 11. The protecting tape 4 functions irrespective of whether its profile size is smaller or larger than that of the antenna 2. As the material of the protecting tape 4 there may be used a plastic or metallic material and the shape thereof may be such a C or doughnut shape as shown in FIG. 12 or FIG. 13.

Also in the case where the protecting tape 4 is C- or doughnut-shaped, the protecting tape 4 has a window for positioning the RFID chip 1. It is optional whether the process (D) of bonding the protecting material 4 to the antenna 2 is to be carried out before or after the ultrasonic bonding process (E). A protecting material may be placed on a protruding portion of the underfill resin protruding from the RFID chip 1 and then the underfill resin may be cured to bond the protecting material.

According to this embodiment described above, a thin paper-like RFID tag of high quality can be manufactured continuously by the paper making process.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications as fall within the ambit of the appended claims.

We claim:

1. A RFID tag comprising:
    a paper-like structure inlaying a RFID thread between a first paper layer and a second paper layer, the RFID thread being connected to a RFID chip through bumps to an antenna arranged onto a base member and being formed with a protecting material provided with a window at a position in which the RFID chip corresponds;
    wherein a height of an upper surface of the protecting material is larger than a height of an upper surface of the RFID chip.

2. The RFID tag according to claim 1, wherein a rigidity of the protecting material is larger than a rigidity of the first paper layer or the second paper layer.

3. The RFID tag according to claim 1, wherein in the window, the upper surface of the RFID chip is arranged within at least one of the first paper layer and the second paper layer.

4. The RFID tag according to claim 2, wherein the protecting material is a polyester material or a polyimide material.

5. The RFID tag according to claim 1, wherein the base member is a film or a tape having a width of 3 mm or less.

6. A RFID tag comprises:
    a paper-like structure inlaying a RFID thread between a first paper layer and a second paper layer, the RFID thread being connected to a RFID chip through bumps to an antenna arranged onto a base member and being formed with a protecting material provided with a window at a position in which the RFID chip corresponds, so as to cover the antenna;
    wherein a height of an upper surface of the protecting material is larger than a height of an upper surface of the RFID chip.

7. The RFID tag according to claim 6, wherein the protecting material is a polyester material or a polyimide material.

* * * * *